(12) United States Patent
Ono et al.

(10) Patent No.: US 6,740,289 B1
(45) Date of Patent: *May 25, 2004

(54) METHOD OF PRODUCING A COMPOSITE MAGNETIC SHEET

(75) Inventors: Norihiko Ono, Yokohama (JP); Shigeyoshi Yoshida, Abiko (JP); Osamu Ito, Akita (JP); Mitsuharu Sato, Yokohama (JP)

(73) Assignee: NEC Tokin Corporation, Miyagi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/613,330

(22) Filed: Jun. 16, 2000

Related U.S. Application Data

(62) Division of application No. 09/068,144, filed as application No. PCT/JP97/03068 on Sep. 2, 1997, now Pat. No. 6,187,120.

(30) Foreign Application Priority Data

| Sep. 3, 1996 | (JP) | 8-233327 |
| Sep. 9, 1996 | (JP) | 8-237995 |
| Sep. 9, 1996 | (JP) | 8-237996 |
| Sep. 13, 1996 | (JP) | 8-243710 |
| Sep. 30, 1996 | (JP) | 8-258310 |

(51) Int. Cl.$^7$ ................................................. B22F 3/18
(52) U.S. Cl. ........................................... 419/65; 419/69
(58) Field of Search ..................................... 419/65, 69

(56) References Cited

U.S. PATENT DOCUMENTS

| 4,320,080 A | * | 3/1982 | Esper et al. ............. 264/111 |
| 4,549,532 A | * | 10/1985 | Baermann ................ 128/1.3 |
| 4,999,217 A | * | 3/1991 | Watanabe et al. ............. 427/48 |
| 5,151,323 A | * | 9/1992 | Kawahara et al. ........... 428/323 |
| 5,284,716 A | * | 2/1994 | Nakano et al. ........ 428/694 BU |
| 5,304,416 A | * | 4/1994 | Goto et al. ................. 428/329 |
| 5,984,856 A | * | 11/1999 | Love ........................... 600/15 |
| 6,187,120 B1 | * | 2/2001 | Ono et al. .................... 156/62 |

FOREIGN PATENT DOCUMENTS

| JP | 800184545 | * | 7/1882 | ............ G11B/5/70 |
| JP | 56110205 | * | 1/1981 | ............ H01F/1/113 |
| JP | 06232587 A | * | 8/1994 | ............ H05K/9/00 |

OTHER PUBLICATIONS

Translation of 06232587A, Aug. 1994, Japan.*

* cited by examiner

Primary Examiner—Daniel J. Jenkins
(74) Attorney, Agent, or Firm—Bradley N. Ruben

(57) ABSTRACT

An atomized mixture of flat soft magnetic powder and an organic binding agent is rolled by mutually confronting two rolling rolls so as to easily produce a composite magnetic sheet excellent in electromagnetic wave absorption characteristic. A plurality of the composite magnetic sheets are stacked by forming unevenness on joining surfaces thereof and rolled so as to realize a desired thickness. By sandwiching a mesh metal layer between the foregoing two composite magnetic sheets and joining them by applying rolling thereto, a mechanically strong electromagnetic interference suppressing sheet can be easily obtained. For reducing reflection and transmittance of electromagnetic waves of the composite magnetic sheet, embossing is applied to obverse and reverse surfaces thereof.

12 Claims, 4 Drawing Sheets

METHOD OF PRODUCING A COMPOSITE MAGNETIC SHEET

This application is a divisional application of Ser. No. 09/068,144 filed May 1, 1998 now U.S. Pat. No. 6,187,120 which is a 371 of PCT/JP97/03068 filed Sep. 2, 1997.

TECHNICAL FIELD

The present invention relates to a method of producing a composite magnetic sheet formed by mixing soft magnetic powder into an organic binding agent and, in particular, to a method of producing a composite magnetic sheet for use in an electromagnetic interference suppressing body.

BACKGROUND ART

An electromagnetic interference suppressing body is used for suppressing electromagnetic interference caused by interference of undesired electromagnetic waves.

Conventionally, for blocking invasion of the external undesired electromagnetic waves into an electronic device, shielding of the electronic device by a conductor has been carried out. However, since the blocking of the electromagnetic waves by the conductor aims to reflect the electromagnetic waves, radiant waves from a certain component within the electronic device may be reflected to adversely affect other components in the same electronic device as secondary noise. Particularly, following reduction in size and increase in working frequency of electronic devices in recent years, problems of the interference due to the external electromagnetic waves and the secondary noise due to the internal electromagnetic waves are serious.

JP-A-7-212079 discloses a composite magnetic body which can suppress interference of undesired electromagnetic waves utilizing absorption of high-frequency waves due to a complex permeability of a soft magnetic body of a certain kind. This composite magnetic body is constituted of a composite magnetic sheet formed by mixing soft magnetic powder into an organic binding agent.

The sheet of the composite magnetic body may be used as it is. On the other hand, by forming a structure stacked with a conductive sheet, the coming electromagnetic waves are absorbed by the composite magnetic sheet and the electromagnetic waves passing through the composite magnetic sheet are reflected by the conductive sheet into the composite magnetic sheet, so as to suppress the interference of the undesired electromagnetic waves.

Such an electromagnetic interference suppressing body is disposed, for example, on the surface of an electronic device or around an electronic component in the electronic device which is liable to suffer an influence of the external electromagnetic waves. Alternatively, it is used so as to be disposed between two printed circuit boards each mounted thereon with electronic components and confronting each other with a space therebetween.

Incidentally, the foregoing composite magnetic sheet has been produced by hot pressing a kneaded slurry material in the form of soft magnetic powder and an organic binding agent suspended and dispersed in an organic solvent.

There is a drawback that when the composite magnetic sheet are produced by the hot pressing, entrainment of the air into the composite magnetic sheets can not be avoided so that the yield of the composite magnetic sheets is bad.

Further, since the producing method based on the hot pressing is a batch process, it is unsuitable for the mass production.

On the other hand, an absorption capacity of undesired electromagnetic waves of the composite magnetic body is determined by a thickness thereof assuming that a material to be used is the same.

Therefore, an object of the present invention is to provide a producing method which can accomplish the mass production of composite magnetic sheets of a required thickness.

Another object of the present invention is to provide a method of producing a composite magnetic sheet which can obtain a high-quality composite magnetic sheet with less entrained air.

Further, another object of the present invention is to provide a method of producing a composite magnetic sheet which, in view of the shape thereof, reduces reflected components and transmitting components and improves the absorption rate of electromagnetic waves.

Another object of the present invention is to provide a method of producing an electromagnetic interference suppressing sheet having a stacked structure of composite magnetic sheets and a conductor layer without readiness of mechanical exfoliation.

DISCLOSURE OF THE INVENTION

According to the present invention, as recited in claim 1, there is obtained a method of producing a composite magnetic sheet characterized by a step of preparing an atomized mixture of soft magnetic powder and an organic binding agent; and a step of rolling the foregoing atomized mixture by mutually confronting two rolls to obtain the foregoing composite magnetic sheet.

Modifications and carrying-out manners of this method are recited in dependent claims 2 and 15.

Further, as recited in claim 16, an electromagentic interference suppressing body using the composite magnetic sheets produced by the foregoing method of the present invention can be produced as a stacked sheet by sandwiching a conductive sheet having a plurality of holes between the two composite magnetic sheets and attaching these sheets under pressure by mutually confronting two rolls.

Carrying-out manners and modifications of the method of producing the electromagnetic interference suppressing body of claim 16 are recited in dependent claims 17 to 19.

BEST MODE FOR CARRYING OUT THE INVENTION

Now, embodiments of the present invention will be explained with reference to the drawings.

Figure 1:
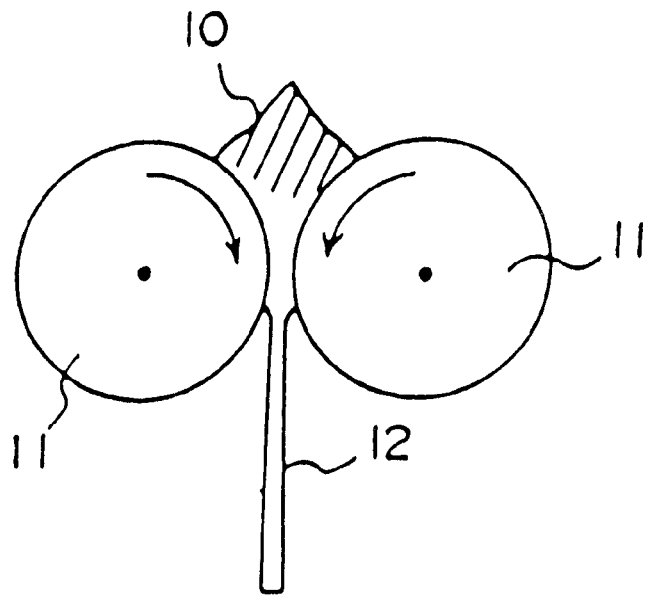
FIG. 1 is a diagram for explaining a method of producing a composite magnetic sheet according to a first embodiment of the present invention.

Referring to FIG. 1, in a method of producing a composite magnetic sheet according to one embodiment of the present invention, by grinding a mixture of soft magnetic powder and an organic binding agent and classifying it, an atomized mixture 10 of the soft magnetic powder and the organic binding agent is first prepared. As the soft magnetic powder, the soft magnetic powder processed into a flat shape is preferably used. The organic binding agent is, for example, an elastomer such as chlorinated polyethylene.

Then, the atomized mixture 10 is supplied between mutually confronting two rolling rolls 11 and rolled so as to obtain a composite magnetic sheet 12.

The composite magnetic sheet 12 is cut into a composite magnetic piece of a desired shape upon, for example, using it, for application to an electronic device so as to be mounted on the electronic device.

Preferably, a mixture having particle diameters smaller than a thickness of the composite magnetic sheet 12 to be produced is used as the atomized mixture 10, and the atomized mixture 10 is rolled through the two rolling rolls 11 confronting with a distance therebetween substantially equal to the given thickness of the composite magnetic sheet 12 to be produced, so as to obtain the composite magnetic sheet 12.

As described above, by setting the particle diameters of the atomized mixture 10 prior to the rolling process to be small, no substantial air entrainment into the composite magnetic sheet 12 is caused so that the high-quality composite magnetic sheet can be obtained.

Further, by subjecting the atomized mixture 10 to the rolling process through the two rolling rolls 11, the atomized mixture 10 including the flat soft magnetic powder can be oriented during the rolling process between the two rolling rolls 11 such that the flat soft magnetic powder becomes parallel to the surface of the composite magnetic sheet 12. By this, deterioration of a transmittance characteristic due to a diamagnetic field can be prevented so that also in this point the composite magnetic sheet 12 becomes high in quality.

Figure 2:
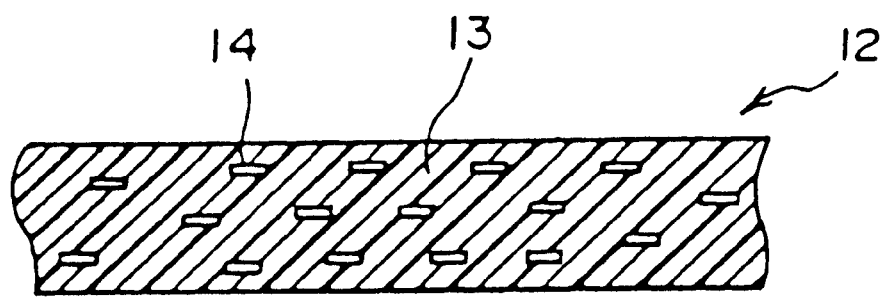
FIG. 2 is a sectional view of the composite magnetic sheet produced by the method of FIG. 1.

FIG. 2 is a sectional view of the composite magnetic sheet 12 showing the state wherein flat soft magnetic powder 14 dispersed into a layer 12 of an organic binding agent is oriented so as to be parallel to the surface of the rolled composite magnetic sheet 12.

Figure 3:
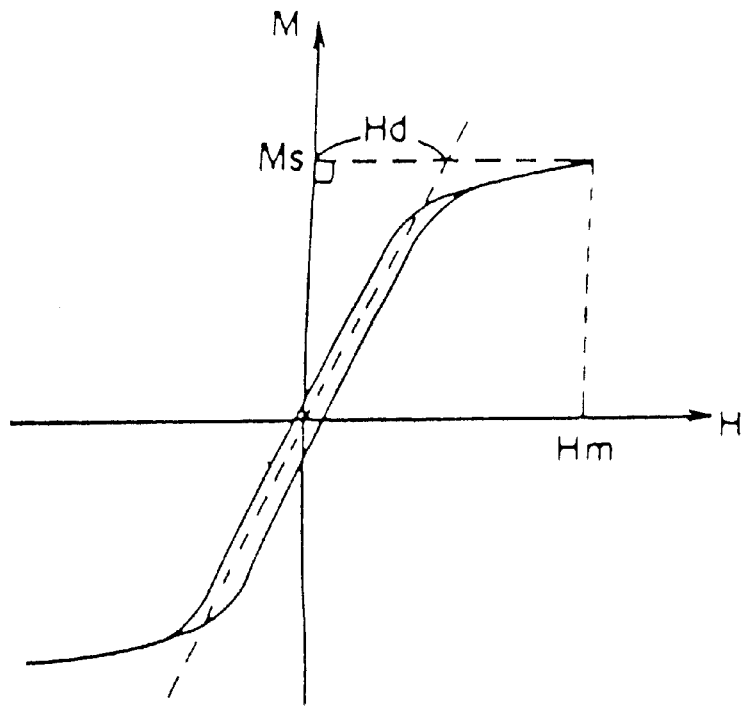
FIG. 3 is a diagram for explaining a diamagnetic field of the composite magnetic sheet produced by the method of FIG. 1.

Here, "a diamagnetic field" Hd will be explained with reference to FIG. 3.

A composite magnetic sample is marked for observation of a magnetic particle orienting direction and processed into a cubic shape. Using a VSM (vibrating type magnetometer), M-H curves (magnetization curves) in an orientation direction of the magnetic particles (magnetization easy axis direction) and a direction perpendicular to the orientation direction (magnetization hard axis direction) are derived, respectively, with respect to the cubic sample. FIG. 3 show the M-H curve. A line (shown by a dotted line in FIG. 3) passing the origin is drawn in parallel to a linear region of the obtained M-H curve, and a magnetic field corresponding to an intersection point between this line and an Ms line (saturation magnetization line) is set to be "a diamagnetic field" Hd.

A diamagnetic field in "the magnetization easy axis direction" is represented by Hde, while a diamagnetic field in "the magnetization hard axis direction" is represented by Hdd.

It was confirmed that the composite magnetic sheet produced by the method of FIG. 1 realized a ratio Hdd/Hde of not less than 4.

As the soft magnetic powder, an Fe-Al-Si alloy (trademark:Sendust) or an Fe-Ni alloy (Permalloy) can be used.

On the other hand, as the organic binding agent, thermoplastic resin, such as polyester resin, chlorinated polyethylene resin, polyvinyl chloride resin, polyvinyl butyral resin, polyurethane resin, cellulose resin, nitrile-butadiene rubber or stylene-butadiene rubber, or a polymer thereof can be used.

Some of these organic binding agents may generate heat to be self-fused due to friction upon rolling by the foregoing two rolls. The degree thereof also depends on a rotational speed of the rolls or a gap between the two rolls. For those with small self-fusing degrees or those with no self fusion, heating rolls may be used as the rolls to cause the self fusion.

It may be arranged that a composite magnetic sheet of a desired thickness is not produced through one rolling process, but the rolling process may be divided and carried out in several times. Specifically, a sheet obtained through one rolling process is further passed under pressure between two rolls with a reduced gap therebetween so that a thin sheet can be obtained. On the contrary, a plurality of, such as two, composite magnetic sheets each produced through one rolling process are passed between two rolls so as to be attached or joined with each other under pressure, and thereby a composite magnetic sheet of a stacked structure with an increased thickness can be obtained. By repeating this method in a plurality of times, a composite magnetic sheet of a given thickness can be obtained. This pressure attaching method is effective for producing a composite magnetic sheet of, particularly a large thickness.

On the other hand, in case of using this pressure attaching method, there is a possibility that exfoliation occurs between the mutually joined two sheets.

Figure 4:
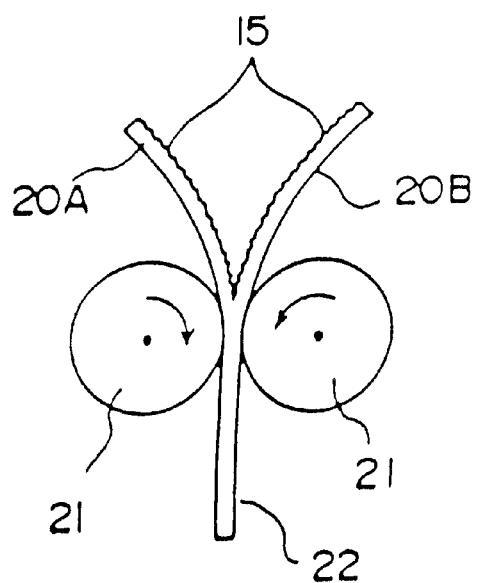
FIG. 4 is a diagram for explaining a method of producing a composite magnetic sheet of a stacked type according to a second embodiment of the present invention.

Referring to FIG. 4, it is preferable to provide in advance unevenness 15 on surfaces, to be mutually attached, of sheets 20A and 20B for preventing such exfoliation.

FIG. 4 is a diagram for explaining this method.

Specifically, embossing is applied onto the surfaces of the first and second composite magnetic sheets 20A and 20B produced by the method of FIG. 1. Through this, the surfaces of the first and second composite magnetic sheets 20A and 20B are formed with the unevenness 15 (that is, ruggedness), respectively. Subsequently, the first and second composite magnetic sheets 20A and 20B are passed between mutually confronting two rolling rolls 21 in the state wherein they are put one over the other with their surfaces, formed with the unevenness 15, being in contact with each other. Through this, both are attached under pressure to obtain a composite magnetic sheet 22 of a stacked structure.

As described above, by providing in advance the unevenness 15 on the surfaces of the first and second composite magnetic sheets 20A and 20B and applying the rolling process by the rolling rolls 21 to the first and second composite magnetic sheets 20A and 20B while they are overlapped with each other, almost no air entrainment into between the first and second composite magnetic sheets 20A and 20B is generated. Thus, the high-quality stacked structure composite magnetic sheet 22 can be obtained, wherein the first and second composite magnetic sheets 20A and 20B are hardly exfoliated from each other.

Further, by providing the unevenness 15 on the surfaces of the first and second composite magnetic sheets 20A and 20B, a mutual contact area between the first and second composite magnetic sheets 20A and 20B upon the rolling process increases so that a mutual attaching or joining strength is enhanced. This also makes it difficult for the first and second composite magnetic sheets 20A and 20B to be mechanically exfoliated so that the stacked structure composite magnetic sheet 22 excellent in mechanical strength can be obtained.

On the other hand, the sheet 20A and/or 20B to be mutually attached in pressure is not limited to the sheet produced by the method of FIG. 1, but the sheet of the stacked structure pressure-attached by the method of FIG. 4 can be used. By this, it is evident that a sheet with a further increased thickness can be obtained.

The surfaces of the composite magnetic sheets 12 and 22 produced by the methods of FIGS. 1 and 4 are flat. Therefore, electromagnetic waves incident upon the composite magnetic sheets have some components to be reflected on those surfaces or to transmit them. For reducing the reflected components and the transmitting components, in the present invention, unevenness is formed on both sides of the composite magnetic sheet by, for example, embossing or the like. A forming method of the unevenness will be described with reference to FIG. 5.

Figure 5:
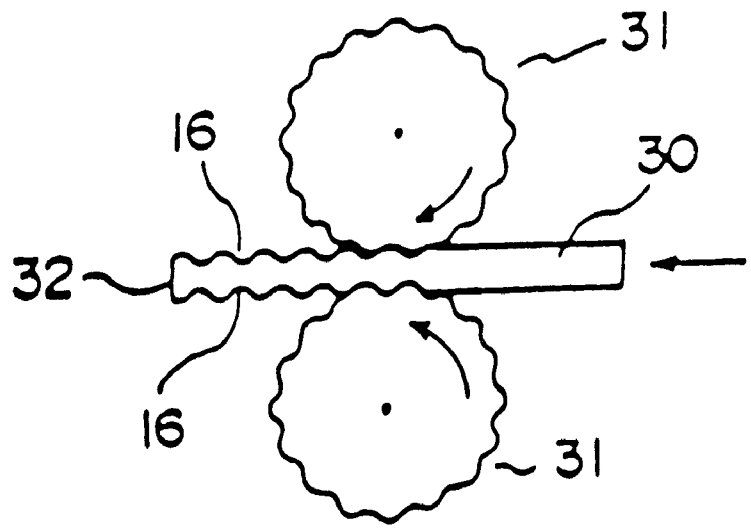
FIG. 5 is a diagram for explaining a method of producing a composite magnetic sheet having unevenness on the surface thereof according to a third embodiment of the present invention.

Referring to FIG. 5, by passing the composite magnetic sheet obtained in FIGS. 1 or 4 (here, collectively represented by 30) between mutually confronting first and second embossing rolls 31 and 31 such that the obverse surface and the reverse surface thereof abut the first and second embossing rolls 31 and 31, respectively, a composite magnetic sheet 32 formed with unevenness (emboss) 16 on the obverse and reverse surfaces thereof can be obtained.

Figure 6:
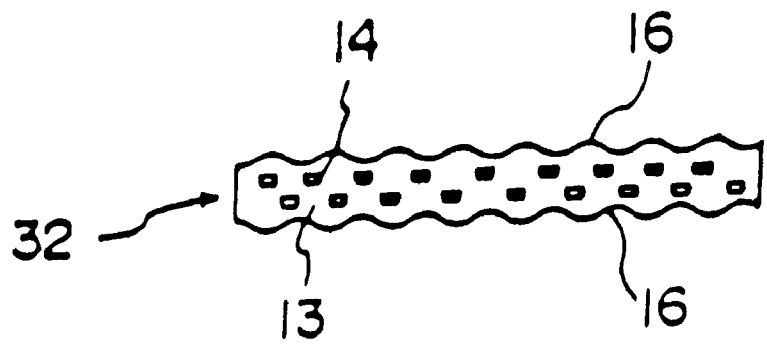
FIG. 6 is a sectional view of the composite magnetic sheet produced by the method of FIG. 5.

As shown by a sectional view of FIG. 6, in the thus produced composite magnetic sheet 32, flat soft magnetic powder 13 is dispersed in a layer 13 of an organic binding agent, and the embossed unevenness 16 is formed on both sides thereof.

Figure 7:
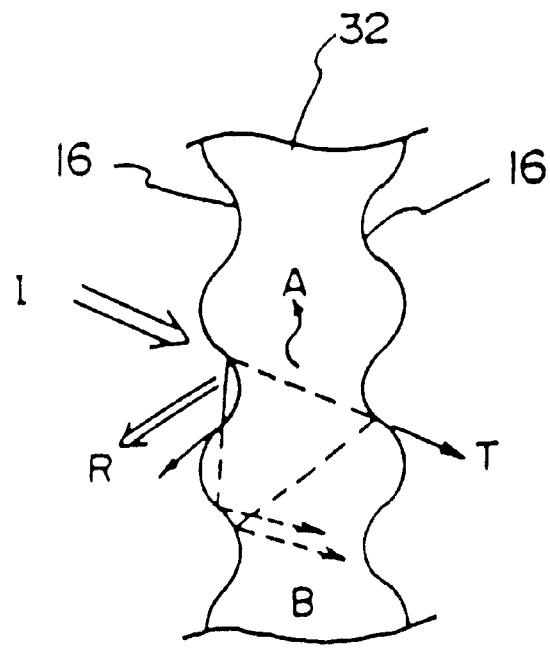
FIG. 7 is a diagram for explaining reduction of transmitting components and reflected components of electromagnetic waves of the composite magnetic sheet of FIG. 5.

Referring to FIG. 7, an electromagnetic wave I incident upon the surface of the composite magnetic sheet 32 having the unevenness 16 on the obverse and reverse surfaces thereof partly enters the composite magnetic sheet 32, while the remaining part thereof is scattered on the unevenness 16 so as to enter the composite magnetic sheet 32 from other portions of the unevenness on the surface. This reduces the reflection level of a reflected wave R. On the other hand, the electromagnetic wave entering the composite magnetic sheet 32 collides with the soft magnetic powder so as to be absorbed as an absorption loss A. The electromagnetic wave, which has reached an outgoing surface on the reverse side without collision, is scattered due to the unevenness of the surface to return into the composite magnetic sheet 32 again and subjected to multiple reflection in the interior so as to be absorbed as the absorption loss A in the course thereof. As a result, a portion of the electromagnetic wave entering the composite magnetic sheet and absorbed due to the multiple reflection in the interior is increased. As a result, the transmittance level of a transmitting wave T through the composite magnetic sheet 32 is lowered, and the reflection level of the reflected wave R is also lowered.

Therefore, by using the composite magnetic sheet 32, the undesired electromagnetic waves can be effectively absorbed.

Figure 8:
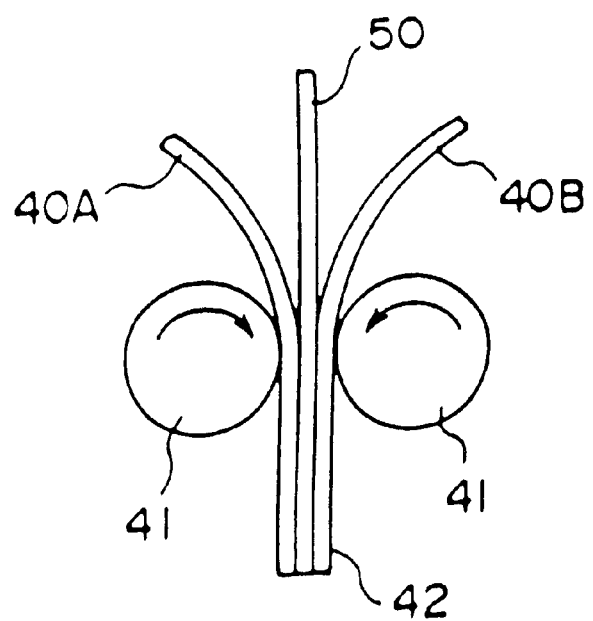
FIG. 8 is a diagram for explaining a method of the present invention for producing an electromagnetic interference suppressing sheet with composite magnetic sheets and conductor being stacked.

FIG. 8 shows a method of producing an electromagnetic interference suppressing body 42 having two composite magnetic sheets 40A and 40B produced by the method of FIGS. 1 or 4 and a conductor 50 which are stacked.

First, two composite magnetic bodies with a desired thickness is prepared according to the method of FIGS. 1 or 4. On the other hand, as the conductive sheet 50 having a plurality of holes, an Ni-plated mesh (net) textile, for example, is prepared.

Then, in the state wherein the conductive sheet 50 is sandwiched between the two composite magnetic sheets 40A and 40B, these sheets are passed between mutually confronting two rolls 41 so as to be attached in pressure with each other. Through this, the sheet electromagnetic interference suppressing body 42 having a conductor layer (50) as a center layer and composite magnetic layers (40A and 40B), being magnetic loss layers, as surface layers can be easily obtained.

Since the conductive sheet 50 has the plurality of holes in the sheet electromagnetic interference suppressing body 42, mutual attaching strength among the first composite magnetic sheet 40A, the conductive sheet 50 and the second composite magnetic sheet 40B are increased so that they are mechanically reluctant to exfoliate from each other. Accordingly, the sheet electromagnetic interference suppressing body excellent in mechanical strength can be obtained.

The conductive sheet 50 is impregnated with, for example, an adhesive such as a bond for vinyl. This also increases the mutual attaching strengths among the first composite magnetic sheet 40A, the conductive sheet 50 and the second composite magnetic sheet 40B. As a result, these sheets are difficult in mechanical exfoliation from each other, and thus the sheet electromagnetic interference suppressing body excellent in mechanical strength can be obtained. In this case, to be concrete, the adhesive such as the bond for vinyl is diluted with a lacquer reducer, applied to the mesh textile as the conductive sheet 50 and dried, so as to impregnate the conductive sheet 50 with the adhesive.

Instead, the Ni-plated mesh textile as the conductive sheet 50 may be impregnated with a thermosetting organic adhesive excellent in adhesive property relative to the organic binding agent of the first and second composite magnetic bodies 40A and 40B (that is, a soluble parameter Sp value is approximate to the organic binding agent).

This sheet electromagnetic interference suppressing body is, for example, cut into an electromagnetic interference suppressing body piece of a desired shape upon use.

INDUSTRIAL APPLICABILITY

As described above, according to the present invention, the atomized mixture of the soft magnetic powder and the organic binding agent is rolled by the mutually confronting two rolls so that the mass-producible composite magnetic sheet excellent in electromagnetic wave absorption capability can be provided.

Further, since the given thickness can be achieved by reducing or increasing the thickness by repeating the rolling, the composite magnetic sheet having a desired electromagnetic wave absorption capability can be obtained.

Further, by providing the unevenness on the surface of the composite magnetic sheet, there can be provided the composite magnetic sheet excellent in electromagnetic wave absorption capability and with reduced reflection and permeation of electromagnetic waves.

Further, according to the present invention, there can be provided the highly effective electromagnetic interference suppressing sheet excellent in blocking and absorbing the electromagnetic waves, which is formed by rolling and attaching under pressure the foregoing composite magnetic sheets and the mesh metal layer.

What is claimed is:

1. A method of producing a composite magnetic sheet, which comprises the steps of:
   preparing a mixture of finely ground soft magnetic powder and an organic binding agent;
   providing a pair of mutually confronting rolls with a gap therebetween, said gap opening at opposite sides of said pair rolls
   feeding said mixture into said gap opening at one side of said paired rolls;
   rolling said rolls to pass said mixture from one side of said paired rolls through said gap and delivering said mixture continuously from said gap opening at the opposite side of said paired rolls to produce said composite magnetic sheet; and
   forming an unevenness by impressing on at least one of the obverse and reverse surfaces of said composite magnetic sheet for suppressing permeation of an electromagnetic wave therethrough.

2. The method as in claim 1, wherein said organic binding agent is caused to fuse by virtue of pressure applied to said mixture by said rolls.

3. The method of producing a composite magnetic sheet as in claim 2, wherein said organic binding agent comprises a self-fusible material and is caused to fuse together by virtue of friction which occurs during rolling.

4. The method of producing a composite magnetic sheet as in claim 2, wherein said pair of rolls are heated to aid in the fusion of the organic binding agent during rolling of the mixture through the gap of said pair of rolls.

5. The method as in any one of said claims 1 to 4, wherein said soft magnetic powder is comprised of flat particles which are oriented in the rolling direction during said rolling.

6. The method as set forth in any one of claims 1 to 4, wherein the composite magnetic sheet is formed into a cube to provide a ratio of Hdd/Hde of not less than about 4, between a diamagnetic field Hdd in a magnetization hard axis direction and a diamagnetic field Hde in a magnetization easy axis direction.

7. The method of producing the composite magnetic sheet as recited in any of claims 1 to 3, wherein the particle size of the soft magnetic powder is smaller than the desired thickness of the composite magnetic sheet produced by said method.

8. The method of producing the composite sheet as in claim 1, which further comprises the step of stacking a plurality of said composite magnetic sheets and applying a pressure-attaching step to said stack of composite magnetic sheets by passing said stack through the gap of said pair of confronting rolls with the uneven surfaces in contact with each other.

9. The method as in claim 1, wherein said impressing is applied to both of the obverse and reverse surfaces of the composite magnetic sheet.

10. The method as in claim 1, wherein the impressing is embossing that provides groves.

11. The method of impressing said composite magnetic sheets as in claim 9, wherein said impressing is carried out by passing said composite magnetic sheet through the gap of a pair of embossing rolls such that the obverse and reverse surfaces of said composite magnetic sheet abut each of said embossing rolls, respectively.

12. The method as in claim 11, wherein the embossing provides a grooved pattern.

* * * * *